(12) United States Patent
Myers et al.

(10) Patent No.: US 8,451,039 B2
(45) Date of Patent: May 28, 2013

(54) APPARATUS FOR STORING A DATA VALUE IN A RETENTION MODE

(75) Inventors: James Edward Myers, Bottisham (GB); John Philip Biggs, Teversham (GB); David Walter Flynn, Cambridge (GB); Carsten Tradowsky, Karlsruhe (GB)

(73) Assignee: ARM Limited, Cambridge (GB)

( * ) Notice: Subject to any disclaimer, the term of this patent is extended or adjusted under 35 U.S.C. 154(b) by 77 days.

(21) Appl. No.: 13/067,183

(22) Filed: May 13, 2011

(65) Prior Publication Data
US 2012/0286850 A1 Nov. 15, 2012

(51) Int. Cl.
*H03K 3/289* (2006.01)

(52) U.S. Cl.
USPC .......................... 327/202; 327/208

(58) Field of Classification Search
USPC .......................... 327/202, 203, 208
See application file for complete search history.

(56) References Cited

U.S. PATENT DOCUMENTS 7,768,331 B1 * 8/2010 Biyani .................... 327/202

OTHER PUBLICATIONS

Choi, K-W, et al., "Optimal Zigzag (OZ): An Effective yet Feasible Power-Gating Scheme Achieving Two Orders of Magnitude Lower Standby Leakage", Symposium on VLSI Circuits Digest of Technical Papers, (2005), pp. 312-315.

Paik, S. et al., "Multiobjective Optimizatin of Sleep Vector for Zigzag Power-Gated Circuits in Standard Cell Elements", vol. 34.2, DAC, (Jun. 8-13, 2008), pp. 600-605.
Shin, Y. et al., "Cell-Based Semicustom Design of Zigzag Power Gating Circuits", ISQED '07, (2007), 6 pages.
Min, K-S et al., "Leakage-Suppressed Clock-Gating Circuit with Zigzag Super Cut-Off CMOS (ZSCCMOS) for Leakage-Dominant Sub-70-nm and Sub-1-V-$V_{DD}$ LSIS", IEEE Transactions on Very Large Scale Integration VLSI Systems, vol. 14, No. 4, Apr. 2006, pp. 430-435.
Kun, H. et al., "Area and MIT Optimization of Selective Zigzag Power Gating", IEEE, 5 pages.
Shin, Y. et al., "Semicustom Design of Zigzag Power-Gated Circuits in Standard Cell Elements", IEEE Transactions on Computer-Aided Design of Integrated Circuits and Systems, vol. 28, No. 3, (Mar. 2009), pp. 327-339.
Miyazaki, T. et al., "Observation of one-fifth-of-a-clock wake-up time of power-gated circuit", IEEE 2004 Custom Integrated Circuits Conference, pp. 87-90.

* cited by examiner

*Primary Examiner* — John Poos
(74) *Attorney, Agent, or Firm* — Nixon & Vanderhye P.C.

(57) ABSTRACT

Apparatus for storing a data value in the form of a master-slave latch supporting zig-zag power gating is described. A NAND gate 52 at the output of the latch forces a predetermined retention signal value at the output from the latch during a retention mode. A scan multiplexer 42 at the input to the latch selects the scan input, which is the predetermined retention signal from another latch, during the retention mode. Within the latch power gated circuitry 32 is subject to zig-zag power gating using virtual power rails VDDZ and VSSZ so as to reduce the leakage current. State storing circuitry 34 is permanently connected to the power supplies VDDG, VSSG such that it is able to maintain whatever signal value is stored therein during the retention mode.

15 Claims, 5 Drawing Sheets

APPARATUS FOR STORING A DATA VALUE IN A RETENTION MODE

BACKGROUND OF THE INVENTION

1. Field of the Invention

This invention relates to the field of data processing systems. More particularly, this invention relates to an apparatus for storing a data value, such as, for example, a latch or a flip-flop, which has a retention mode of operation in which the data value is retained but a lower level of power is consumed.

2. Description of the Prior Art

It is known to adapt data processing apparatus in the form of integrated circuits to reduce the power consumed. One way of achieving this is to provide a retention mode in to which the apparatus may be placed when it is not desired to perform data processing operations while retaining the data and state currently held within the integrated circuit. The power consumed in the retention mode may be significantly reduced compared to the power consumed in the functional mode when the integrated circuit is actively performing data processing operations.

As the device size geometries decrease within integrated circuits, a significant problem that arises is the power consumed due to leakage currents. Such leakage currents arise even when the integrated circuit is in a retention mode in which active data processing is not performed. In order to address the problems of leakage current, it is known to utilise power gating. In power gating a portion of an integrated circuit may be isolated from the power supply during a retention mode so as to reduce the leakage current through that portion. A problem with power gating is that the time taken to restart processing operations may be comparatively large as the signal nodes and power/signal lines within the portion of the integrated circuit which has been isolated from the power supply will need to recharge to their starting levels before processing can be restarted. Furthermore, there may be problems such as crowbar currents in which a significant amount of power is consumed by gates pulling single nodes in opposite directions until a proper starting state has been reached.

One way of dealing with these problems within integrated circuits using power gating is to provide what is termed "zig-zag" power gating. Zig-zag power gating is a leakage mitigation technique where a predetermined logic state (sleep vector) is applied to a design in the retention mode and then all leaking pull up/pull down stacks of gates are disconnected from one of the power or ground using distributed power gates. The signal nodes are maintained at their proper values as they remain connected to the appropriate power rail (either power or ground), but the leaking pull up or pull down stacks are disconnected from one of the power rails thereby reducing leakage through the stack. This allows for a quicker turn on time since the logic levels are maintained. Furthermore, as no charging or discharging of nodes or signal capacitances is required, and no crowbar currents arise, power consumption upon start up is reduced.

In order to force the portion of the integrated circuit being subject to the zig-zag power gating in to the appropriate state corresponding to the sleep vector, both state retention devices (latches, flops etc.) and primary inputs should be controllable. Primary inputs may be controlled by the insertion of isolation/clamp cells at the power domain boundary. State retention devices may be controlled to produce known outputs by the use of a NAND/NOR gate on their output and controlled using a state retention signal. Such a NAND/NOR gate may be placed inside the state retention device itself.

Using the above techniques a state retention device may be placed in to a state matching the sleep vector. However, the input to the state retention device may be either 1 or 0, depending upon the upstream circuitry and the data value to be stored by the state retention device during the retention mode may also be 1 or 0. A known way of dealing with this problem is to provide four variants of the state retention device. The variants respectively correspond to the inputs being either 1 or 0 and the output corresponding to the stored data value being forced to either 1 or 0. A significant problem with this approach is that it increased the number of variants of the state retention devices required within a cell library from which an integrated circuit design is assembled. Each of these variants requires separate design, characterisation and testing. This impairs the usefulness of zig-zag power gating as a leakage mitigation technique.

SUMMARY OF THE INVENTION

Viewed from one aspect the present invention provides apparatus for storing a data value, said apparatus comprising:

input selecting circuitry having a scan enable input, a scan input and a functional input and configured to select for output as a selected signal in dependence upon a scan enable signal from said scan enable input one of a scan input signal from said scan input or a functional input signal from said functional input;

power gated circuitry coupled to said input selecting circuitry to receive said selected signal and configured to generate an intermediate signal in dependence upon said selected signal;

state storing circuitry coupled to said power gated circuitry to receive said intermediate signal and configured to store a stored signal with a value dependent upon said intermediate signal;

output generating circuitry coupled to said state storing circuitry, said output generating circuitry having a retention mode input and a data value output and being configured to generate an output signal for output from said data value output in dependence upon a retention mode signal received at said retention mode input and indicating operation in one of a retention mode and a functional mode such that: (i) during said functional mode, said output signal is dependent upon said stored signal; and (ii) during said retention mode, said output signal is a predetermined retention signal; and power supply circuitry coupled to said power gated circuitry, a first power supply and a second power supply, wherein said power supply circuitry and said input selecting circuitry are configured such that: (a) during said functional mode, said input selecting circuitry selects said functional signal and said power gating circuitry connects at least a first portion of said power gated circuitry to both said first power supply and said second power supply; (b) during said retention mode, said input selecting circuitry selects said scan input signal and said power supply circuitry isolates at least said first portion of said power gated circuitry from said first power supply and connects at least said first portion of said power gated circuitry to said second power supply; and (c) during both said functional mode and said retention mode said power supply circuitry connects at least a portion of said state storing circuitry to both said first power supply and said second power supply.

The present technique recognises that the apparatus for storing a data value will typically already include input selecting circuitry controlled by a scan enable signal for supporting the inclusion of the apparatus for storing a data value within a serial scan chain during, for example, manufacturing test and/or debugging. The scan enable input to the apparatus for storing a data value can be used to select the scan input rather than the normal functional input during retention mode operation. In combination with this input selection, the apparatus for storing a data value includes output generating circuitry configured to output a signal with a predetermined retention value during the retention mode. In this way, a predetermined retention value from an apparatus for storing a data value upstream within the serial scan chain, or elsewhere, may be selected for input to a given apparatus for storing a data value and the apparatus for storing a data value itself also generates an output signal having the predetermined retention value. These signal routings will likely already exist to support serial scan chain operation. This technique removes the need to produce multiple variants of the apparatus for storing the data value in a manner which reduces the design, characterisation and testing overhead associated with supporting zig-zag power gating.

The state storing circuitry within the apparatus for storing a data value remains coupled to both the power and the ground during the retention mode such that it is able to properly store either a 1 or 0. Other power gated circuitry within the apparatus for storing a data value, such as the master portion of a master-slave latch, will be connected to both the power and the ground power supplies during functional mode, but connected to an appropriate one of the power or ground during retention mode thereby reducing the leakage current in the power gated circuitry during the retention mode.

It will be appreciated that different portions of the power gated circuitry may need to be connected to a different one of the first power supply and the second power supply (i.e. the power and the ground) during the retention mode so as to mitigate the leakage currents while retaining the proper signal values within these different portions of the power gated circuitry. As the input to the power gated circuitry through the input selecting circuitry is known as it is taken from the scan input, then which of the power supplies to different portions of the power gated circuitry needs to be isolated can also be determined at design time and statically implemented. In this way, when the power gated circuitry includes a plurality of signal nodes, each of the signal nodes may be driven by one of a first portion of the power gated circuitry or a second portion of the power gated circuitry which are respectively isolated from different ones of the first power supply and the second power supply during the retention mode.

While the apparatus for storing a data value as recited above may be considered in isolation, it is normally implemented by coupling the data value output to a scan input of a further apparatus for storing a data value as part of a serial scan chain within an integrated circuit.

The power gated circuitry may be configured to isolate the state storing circuitry from the intermediate signal in dependence upon a clock signal. This facilitates the provision of the apparatus for storing a data value in the form of a master-slave latch in which the power gated circuitry is part of a master portion and the state storing circuitry is part of a slave portion.

The state storing circuitry is required to store either 1 or 0 during the retention mode and accordingly requires at least a part of the state saving circuitry to be connected to both of the power supplies during the retention mode. However, leakage current mitigation within the state storing circuitry may be enhanced by providing balloon circuitry, with this balloon circuitry being configured to store the stored signal during the retention mode. The gates from which the balloon circuitry is formed may be configured to be less prone to leakage currents, e.g. being smaller in size, slower in operation, higher threshold voltages, etc. Thus, a portion of the state storing circuitry may also be isolated from a respective one of the first power supply and the second power supply during the retention mode.

The first power supply circuitry may comprise a virtual power rail coupled to the first power supply by first power switching gates with these first power switching gates being configured to isolate the first virtual power rail from the first power supply during the retention mode. In a similar way, the power supply circuitry may comprise a second virtual power rail coupled to the second power supply by second power switching gates with these being configured to isolate the second virtual power rail from the second power supply during the retention mode.

The power supply circuitry may further comprise a first power rail coupled to the first power supply during both retention mode and the functional mode and a second power rail coupled to the second power supply during both the retention mode and the functional mode. Thus, the apparatus for storing a data value may have four power inputs respectively taken from the first and second power rails and the virtual first and second power rails.

It will be appreciated that the first power supply and the second power supply may be respectively ones of a VDD power supply and a ground power supply as conventionally used within integrated circuits.

The predetermined retention signal may be either 1 or 0. Different integrated circuit designs will typically be rich in either 1 or 0 values stored within their state retention devices. Selecting the predetermined retention value to match the predominant value stored within the state retention devices has the advantage that when emerging from the retention mode fewer signal nodes/lines need to change signal level and consume power by propagating such a change through logic fanning out from those stored signal values.

Viewed from another aspect the present invention provides apparatus for storing a data value, said apparatus comprising:

input selecting means for selecting a selected signal for output, said input selecting means having a scan enable input, a scan input and a functional input, said input selecting means configured to select as said selected signal for output, in dependence upon a scan enable signal from said scan enable input, one of a scan input signal from said scan input or a functional input signal from said functional input;

power gated means for generating an intermediate signal in dependence upon said selected signal, said power gated means being coupled to said input selecting means to receive said selected signal;

state storing means for storing a stored signal with a value dependent upon said intermediate signal, said state storing means being coupled to said power gated means to receive said intermediate signal;

output generating means for generating an output signal, said output generating means having a retention mode input and a data value output, being coupled to said state storing means, and being configured to generate said output signal for output from said data value output in dependence upon a retention mode signal received at said retention mode input and indicating operation in one of a retention mode and a functional mode such that: (i) during said functional mode, said output signal is dependent upon said stored signal; and (ii) during said retention mode, said output signal is a predetermined retention signal; and power supply means for supplying power to said power gated means form a first power supply and a second power supply, wherein said power supply means and said input selecting means are configured such that: (a) during said functional mode, said input selecting means selects said functional signal and said power gating means connects at least a first portion of said power gated means to both said first power supply and said second power supply; (b) during said retention mode, said input selecting means selects said scan input signal and said power supply means isolates at least said first portion of said power gated means from said first power supply and connects at least said first portion of said power gated means to said second power supply; and (c) during both said functional mode and said retention mode said power supply means connects at least a portion of said state storing means to both said first power supply and said second power supply.

Viewed from a further aspect the present invention provides a method of storing a data value, said method comprising the steps of:

selecting as a selected signal, in dependence upon a scan enable signal, one of a scan input signal or a functional input signal;

generating with power gated circuitry an intermediate signal in dependence upon said selected signal;

storing with state storing circuitry a stored signal with a value dependent upon said intermediate signal;

generating an output signal in dependence upon a retention mode signal indicating operation in one of a retention mode and a functional mode such that: (i) during said functional mode, said output signal is dependent upon said stored signal; and (ii) during said retention mode, said output signal is a predetermined retention signal; and supplying power to said power gated circuitry form a first power supply and a second power supply, wherein (a) during said functional mode, said functional signal is selected and at least a first portion of said power gated circuitry is connected to both said first power supply and said second power supply; (b) during said retention mode, said scan input signal is selected, at least said first portion of said power gated circuitry is isolated from said first power supply and at least said first portion of said power gated circuitry is connected to said second power supply; and (c) during both said functional mode and said retention mode at least a portion of said state storing circuitry is connected to both said first power supply and said second power supply.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
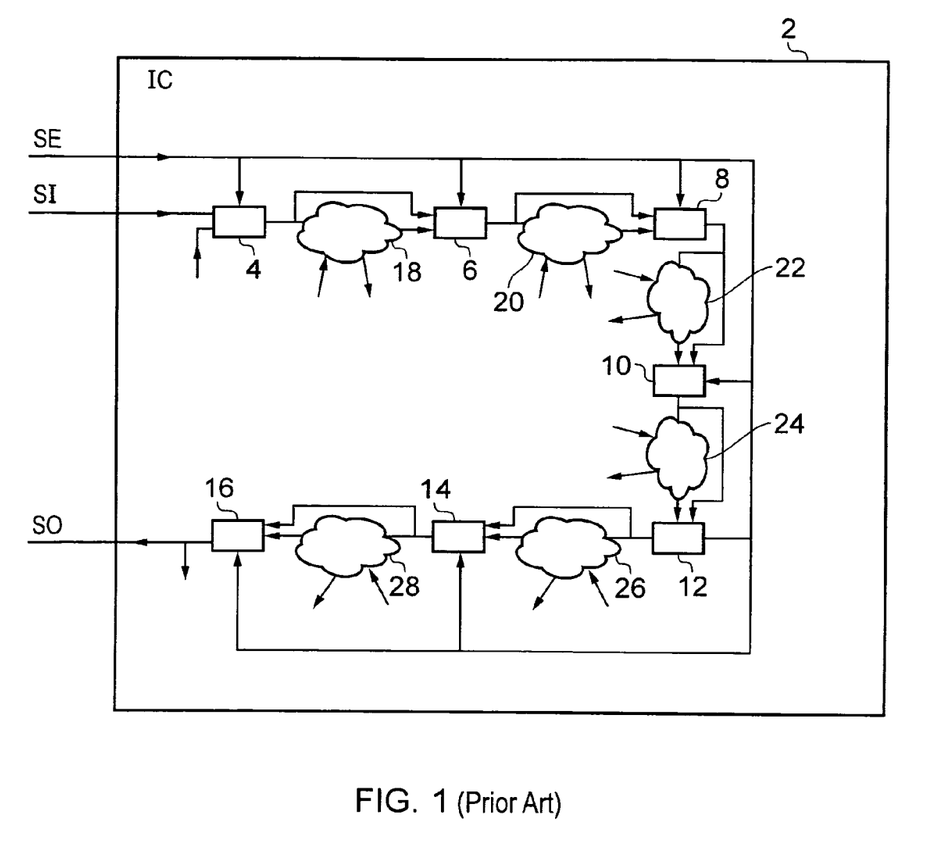
FIG. 1 schematically illustrates an integrated circuit incorporating a serial scan chain.

FIG. 1 schematically illustrates an integrated circuit 2 including a plurality of master-slave latches 4, 6, 8, 10, 12, 14, 16 connected to form a serial scan chain during test operation. The master-slave latches 4 to 16 are also connected together during a retention mode of operation as will be described later. In a functional mode of operation, each latch 4 to 16 receives its input from associated functional mode processing circuitry 18, 20, 22, 24, 26, 28. Thus, each master-slave latch 4 to 16 can receive either a serial scan input signal SI or a functional input signal. A scan enable signal SE controls which of the two inputs to the master-slave latch 4 to 16 is selected.

During the retention mode, the scan enable signal is used to control the input selection to each of the master-slave latches 4 to 16 to select the scan input as provided by the output from the preceding master-slave latch 4 to 16 within the serial scan chain. The first master-slave latch 4 within the serial scan chain receives its input from outside of the integrated circuit and the final master-slave latch 16 supplies its output SO as an output of the integrated circuit 2. It will be appreciated that the functional mode processing logic 18 to 28 which operates during the functional mode to generate the input to the master-slave latches 4 to 16 will typically include many other inputs taken from within the integrated circuit 2, and need not necessarily receive an input from the master-slave latch preceding the master-slave latch receiving the output from that functional circuitry within the serial scan chain. The arrangement of FIG. 1 will generally be familiar to those in this technical field.

Figure 2:
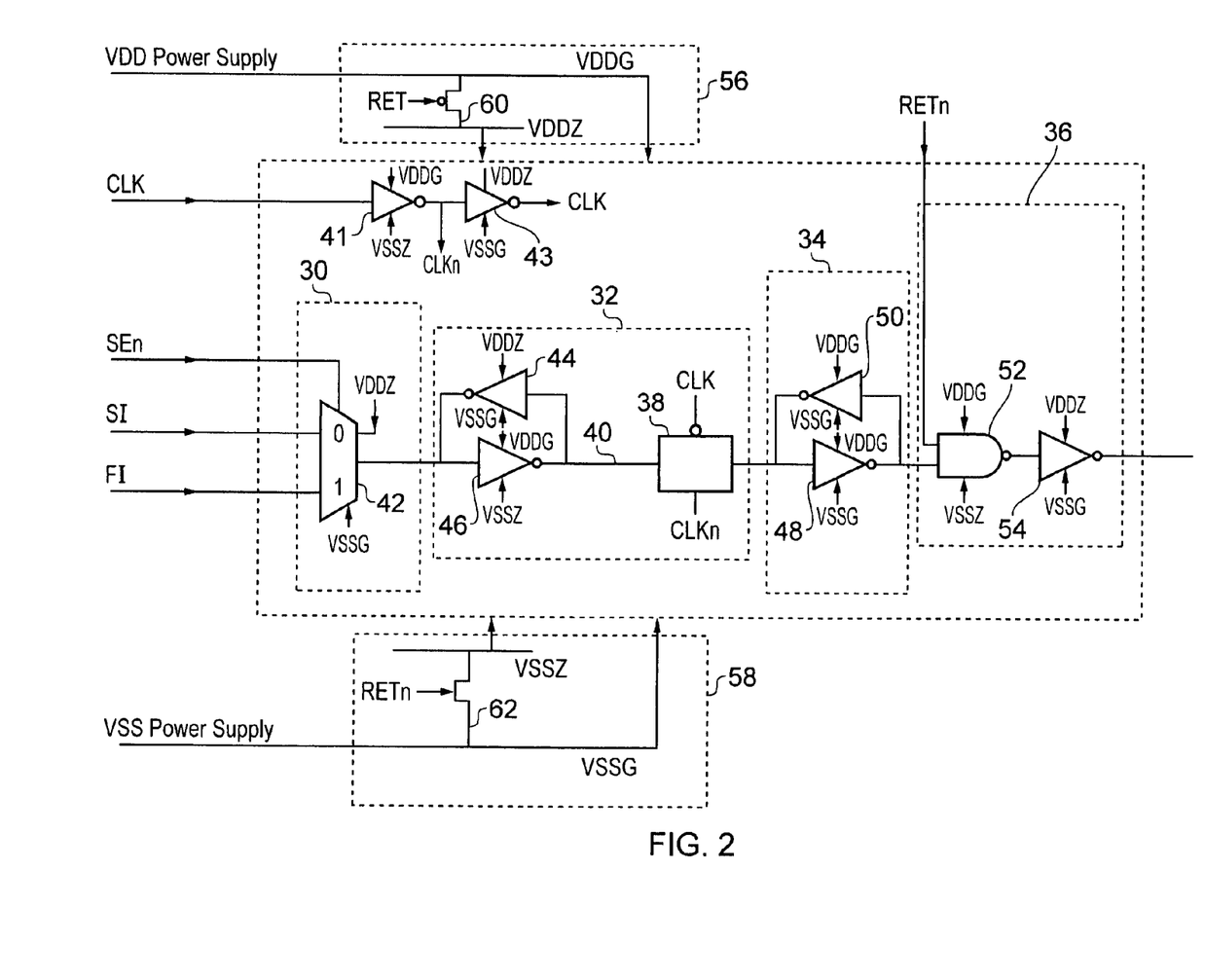
FIG. 2 schematically illustrates an apparatus for storing a data value (a master-slave latch) adapted for use with zig-zag power gating.

FIG. 2 schematically illustrates an apparatus for storing a data value in the form of a master-slave latch supporting zig-zag power gating. The master-slave latch includes input selecting circuitry 30, power gated circuitry 32, state storing circuitry 34 and output generating circuitry 36 connected in series. The power gated circuitry 32 serves as a slave portion within the master-slave latch and the state storing circuitry 34 serves as a master portion within the master-slave latch. A transmission gate 38 serves to selectively pass an intermediate signal generated at the node 40 by the power gated circuitry 32 to the state storing circuitry 34 under control of a clock signal CLK generated by invertors 41, 43.

The input selecting circuitry is in the form of a multiplexer 42 controlled by a scan enable signal SE which is supplied to the integrated circuit 2 as a whole, or at least to the serial scan chain of which this master-slave latch forms a part. The multiplexer 42 includes a scan input SI and a functional input FI. During the functional mode of operation, the functional input FI is selected by the multiplexer 42 and during the retention mode of operation, the scan input is selected by the multiplexer 42. The power gated circuitry 32 includes an inverter pair 44, 46 which serves to store the signal value input that 2 from the multiplexer 42. The inverter pair 44, 46 generates the intermediate signal which is passed via the transmission gate 38 under control of the clock signal CLK, CLKn to the state storing circuitry 34 which serves as the slave portion of the master-slave latch. The state storing circuitry 34 includes an inverter pair 48, 50 which serves to store a stored signal as supplied to the state storing circuitry 34 via the transmission gate 38 upon the appropriate phase of the clock signal CLK. As will be familiar to those in this technical field, the signal value from the functional input FI is captured within the master portion during a first phase of the clock signal CLK and is passed to and stored within the slave portion during a second phase of the clock signal CLK.

The output generating circuitry 36 includes a NAND gate 52 and an inverter 54. Many standard latches have two inverters after the slave. The provision of the NAND gate 52 may, for example, be achieved by expanding the cell by one poly pitch and converting the first weak inverter into a NAND by adding to additional gates. The NAND gate 52 receives as one input a retention mode signal RETn and as another input the output from the inverter pair 48, 50 storing the stored signal. When the retention mode signal RETn indicates that the retention mode is active, this forces the output of the NAND gate 52 high and thus the output of the inverter 54 low such that the output from the apparatus for storing data illustrated in FIG. 2 is forced low (corresponding to a value of 0).

Also illustrated in FIG. 2 is the power supply circuitry which has a first part 56 and a second part 58. The first part of the power supply circuitry connects a virtual power rail VDDZ via power switching gates 60 to the VDD power supply for the integrated circuit (not illustrated). A permanently powered power rail VDDG is also connected to the VDD power supply. In this way, the virtual power rail VDDZ may be isolated from the VDD power supply by turning off the power gating transistor 60 under control of the retention mode signal RET.

In a similar way, the second portion 58 of the power supply circuitry provides a ground rail VSSG that is permanently connected to the VSS power supply (ground) and a virtual ground rail VSSZ which is connected via power switching gates 62 to the VSS power supply. The power switching gate 62 are also controlled by the retention mode signal RETn so as to isolate the virtual rail VSSG providing the virtual ground during the retention mode.

In some embodiments the present techniques may be used in combination with the techniques described in the two co-pending applications entitled "Supplying a clock signal and a gated clock signal to synchronous elements" and "Integrated Circuit, Method of Generating a Layout Of An Integrated Circuit Using Standard Cells, And A Standard Cell Library Providing Such Standard Cells" both assigned to the same assignee as the present application and filed on the same day as the present application. The content of these co-pending application(s) is incorporated herein by reference in its entirety.

Figure 3:
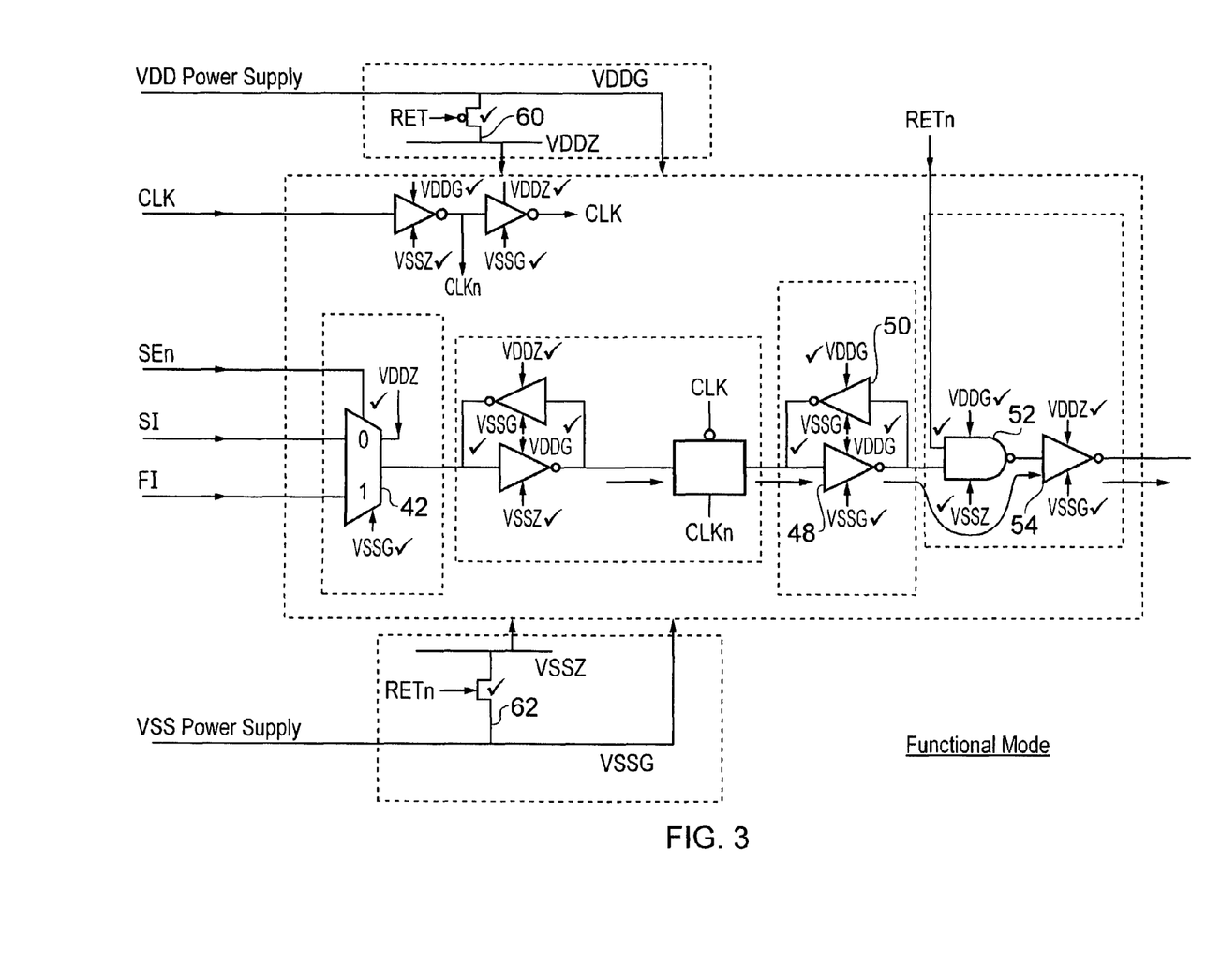
FIG. 3 schematically illustrates the operation of the circuit of FIG. 2 during a functional mode.

FIG. 3 schematically illustrates the operation of the circuit of FIG. 2 during functional mode. During functional mode the retention signal is not asserted and accordingly the power switching gates 60 and 62 are conductive so that the virtual power rails VDDZ and VSSZ are not isolated from their respective VDD power supply and VSS power supply. The power supplies fed to each of the elements within the circuit of FIG. 2 are shown. In the functional mode, all of the power supplies are active and accordingly the circuit of FIG. 2 acts as a normal master-slave latch with a scan multiplexer 42 at its input. When the scan enables signal is not asserted, the functional input FI is passed through the master portion and the slave portion of the latch and under control of the clock signal CLK. The NAND gate 52 passes the output from the inverters 48, 50 through to the inverter 54 where it is used to generate the data output, which may be 1 or 0.

Figure 4:
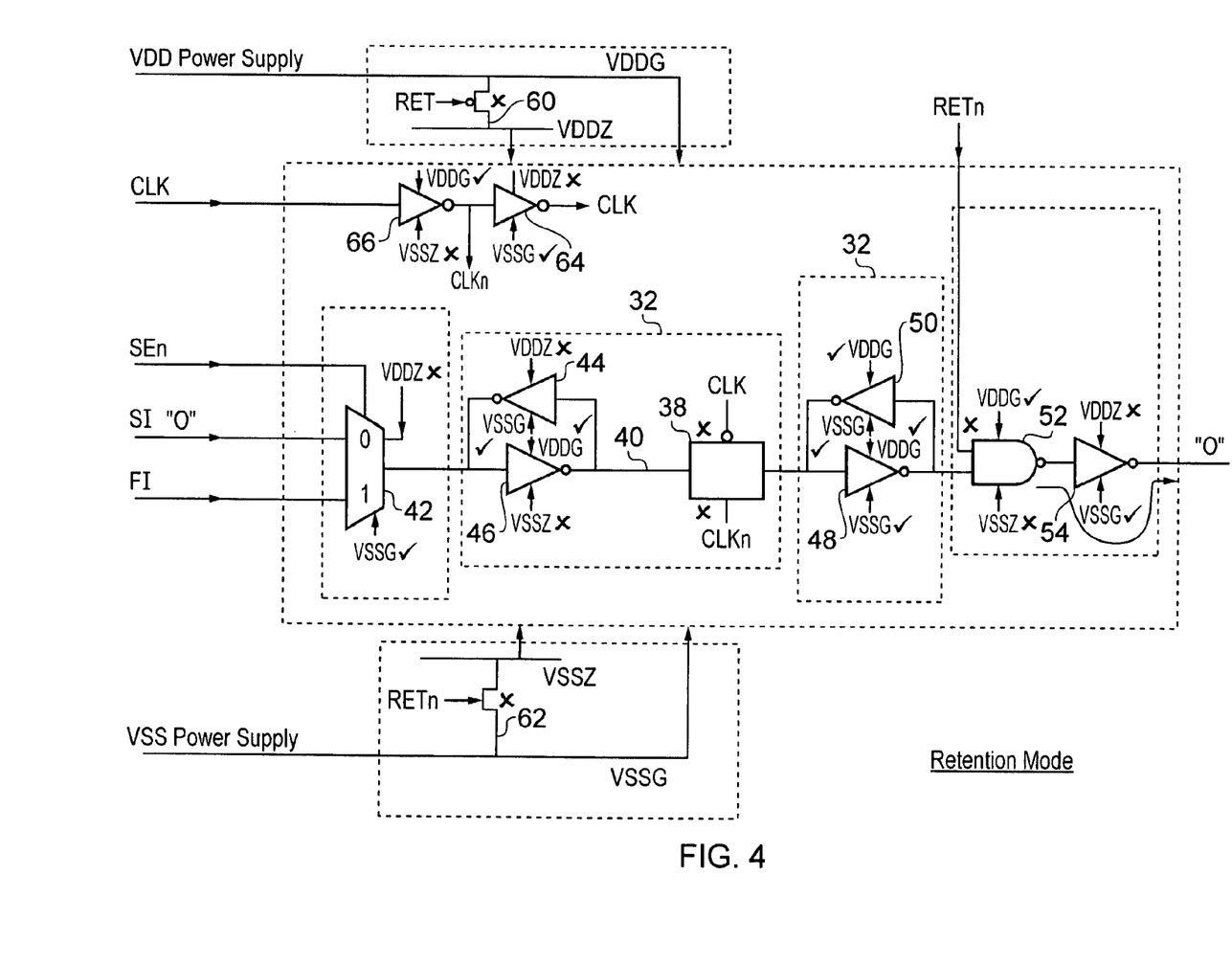
FIG. 4 schematically illustrates the operation of the circuit of FIG. 2 during a retention mode.

FIG. 4 illustrates the operation of the circuit of FIG. 2 during the retention mode. During the retention mode the power switching gates 60, 62 are non-conductive and accordingly the virtual power rails VDDZ and VSSZ are isolated from their respective power supplies. The normal power rails VDDG and VSSG remain connected to their respected power supplies. The power supply used by each of the elements within the circuit of FIG. 2 is illustrated in FIGS. 2, 3 and 4. In FIG. 4 a tick indicates that a power supply is active and a cross indicates that a power supply is inactive (isolated from its respective power source). Circuit elements which are required to generate a 0 value are connected to the permanent ground VSSG and connected to the virtual supply VDDZ such that during the retention mode the connection to ground remains active and the connection to VDD is isolated. In this way, a proper 0 value can be maintained and yet leakage current mitigated as the connection the VDD power supply via the virtual power rail VDDZ is isolated.

In the example circuit, the multiplexer 42, the inverter 44, the inverter 54 and an inverter 64, which generates a true version of the clock signal CLK, are all powered with a permanent connection to the ground VSSG and a connection to the virtual supply VDDZ as these circuit elements are required to generate a value of 0 during the retention mode. In an analogous way the inverter 46, the NAND gate 52 and an inverter 66, which generates an inverse form of the clock signal CLKn, are all powered by a permanent source power supply VDDG and a virtual ground connection VSSZ since these circuit elements are required to produce an output value of 1 during the retention mode.

The state storing circuitry 34 formed of the inverters 48 and 50 must be able to store either a 0 or 1 value during both the functional mode and the retention mode and accordingly both of the inverters 48, 50 are connected to the permanent supply VDDG and the permanent ground VSSG connections. As a consequence, the state storing circuitry 32 will suffer from leakage.

It is possible in some embodiments to utilise a balloon circuit (not illustrated) within the state storing circuitry 32 and use this balloon circuitry to store the stored signal during the retention mode. In this case the inverters 48, 50 may be powered off during retention mode and isolated from the power supplies as the stored signal is securely held within the balloon circuitry. The gates forming the balloon circuitry will typically be formed to inherently have a reduced level of leakage, such as using smaller gates, gates with a higher threshold voltage etc.

The retention signal input to the NAND gate 52 forces the output from the NAND gate 52 to be high and accordingly the output signal from the inverter 54 to be low. This is the predetermined retention signal. It has been found that in many processor designs there is a predominance of 0 values stored within latches and accordingly the predetermined retention signal may be selected in this way to match the predominant signal values which are in reality stored and will need to be output from the latch when power is resumed.

A scan input SI receives a value 0 supplied from another latch generating its predetermined retention output. This scan input is passed via the multiplexer 42 to the power gated circuitry 32. The inverter 46 has the correct power supply such that it is able to generate a value of 1 at node 40 corresponding to the scan input value 0. Similarly, the inverter 44 has the appropriate power supply such that it is able to feed-back a value of 0 to the input to the inverter 46 commensurate with the signal value of 1 at node 40. The inverters 64 and 66 which generate the clock signals used by the transmission gate 38 have power supplies matching the signal level for the clock signal CLK that is to be generated during the retention mode in order to hold the transmission gate 38 non-transmissive.

Figure 5:
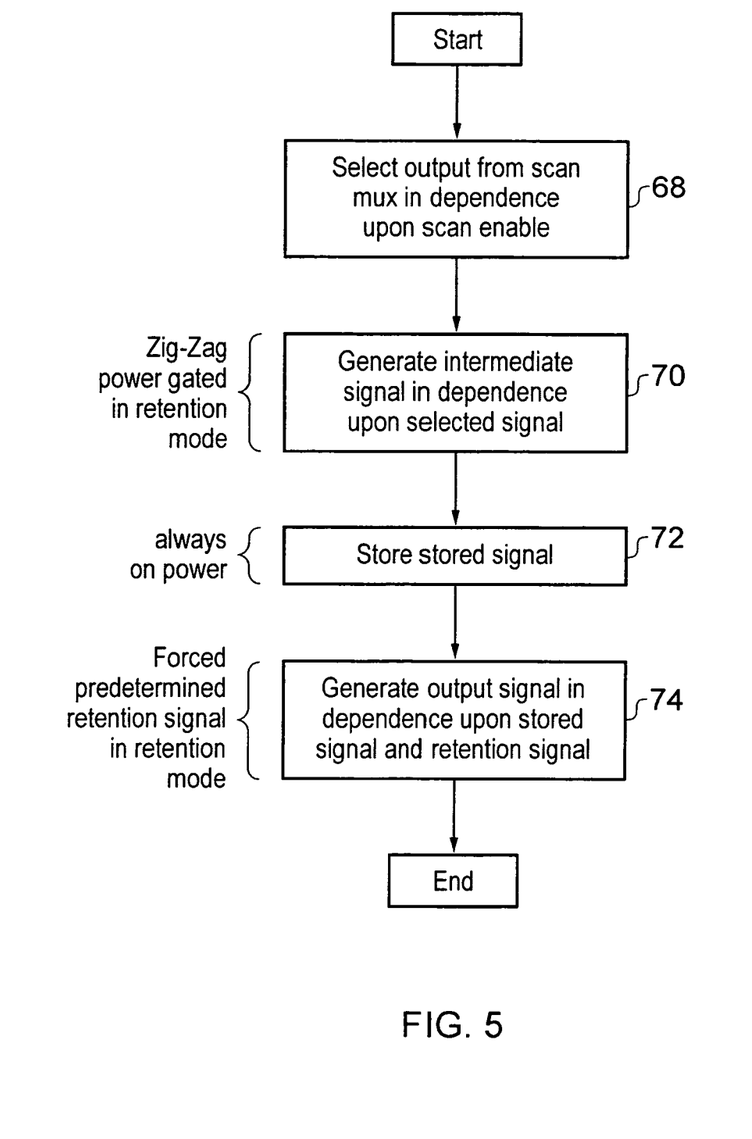
FIG. 5 is a flow diagram schematically illustrating the operation of the circuit of FIG. 2.

FIG. 5 is a flow diagram schematically illustrating the operation of the circuit of FIG. 2. At step 68 an output is selected from the multiplexer 42 in dependence upon the scan enable signal SE. At step 70 the power gated circuitry 32 generates the intermediate signal at node 40 in dependence upon the selected signal fed to it from the multiplexer 42. During the retention mode, the power gated circuitry 32 is subject to zig-zag gating with the appropriate power supplies being isolated to the inverters 44, 46. At step 72 the state storing circuitry 34 stores a signal passed to it via the transmission gate 38 from the node 40. The state storing circuitry 34 is powered from both power and ground during both the functional mode and the retention mode (although a balloon circuit may be used to enable an at least partial power down). At step 74 the output generating circuitry 36 generates the output signal in dependence upon the stored signal within the state storing circuitry 34 and the retention mode signal as received by the NAND gate 52. The NAND gate 52 serves to force a predetermined retention signal to be output from the latch during the retention mode.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for storing a data value, said apparatus comprising:
   input selecting circuitry having a scan enable input, a scan input and a functional input and configured to select for output as a selected signal in dependence upon a scan enable signal from said scan enable input one of a scan input signal from said scan input or a functional input signal from said functional input;
   power gated circuitry coupled to said input selecting circuitry to receive said selected signal and configured to generate an intermediate signal in dependence upon said selected signal;
   state storing circuitry coupled to said power gated circuitry to receive said intermediate signal and configured to store a stored signal with a value dependent upon said intermediate signal;
   output generating circuitry coupled to said state storing circuitry, said output generating circuitry having a retention mode input and a data value output and being configured to generate an output signal for output from said data value output in dependence upon a retention mode signal received at said retention mode input and indicating operation in one of a retention mode and a functional mode such that: (i) during said functional mode, said output signal is dependent upon said stored signal; and (ii) during said retention mode, said output signal is a predetermined retention signal; and
   power supply circuitry coupled to said power gated circuitry, a first power supply and a second power supply, wherein
   said power supply circuitry and said input selecting circuitry are configured such that: (a) during said functional mode, said input selecting circuitry selects said functional signal and said power gating circuitry connects at least a first portion of said power gated circuitry to both said first power supply and said second power supply; (b) during said retention mode, said input selecting circuitry selects said scan input signal and said power supply circuitry isolates at least said first portion of said power gated circuitry from said first power supply and connects at least said first portion of said power gated circuitry to said second power supply; and (c) during both said functional mode and said retention mode said power supply circuitry connects at least a portion of said state storing circuitry to both said first power supply and said second power supply, wherein said power supply circuitry comprises a first virtual power rail coupled to said first power supply by first power switching gates and said first power switching gates are configured to isolate said first virtual power rail from said first power supply during said retention mode.

2. Apparatus as claimed in claim 1, wherein said data value output is coupled to a scan input of a further apparatus for storing a data value as part of a serial scan chain.

3. Apparatus as claimed in claim 1, comprising a clock input for receiving a clock signal and wherein said power gated circuitry is configured to isolate said state storing circuitry from said intermediate signal in dependence upon said clock signal.

4. Apparatus as claimed in claim 1, wherein said apparatus is master-slave latch circuitry having a master portion and a slave portion, said power gated circuitry is part of said master portion and said state storing circuitry is part of said slave portion.

5. Apparatus as claimed in claim 1, wherein said power supply circuitry comprises a second virtual power rail coupled to said second power supply by second power switching gates and said second power switching gates are configured to isolate said second virtual power rail from said second power supply during said retention mode.

6. An integrated circuit comprising a plurality of apparatus as claimed in claim 1, wherein said predetermined retention signal for each of said plurality of apparatus corresponds to a zero data value.

7. An integrated circuit comprising a plurality of apparatus as claimed in claim 1, wherein said predetermined retention signal for each of said plurality of apparatus corresponds to a one data value.

8. Apparatus for storing a data value, said apparatus comprising:
   input selecting circuitry having a scan enable input, a scan input and a functional input and configured to select for output as a selected signal in dependence upon a scan enable signal from said scan enable input one of a scan input signal from said scan input or a functional input signal from said functional input;
   power gated circuitry coupled to said input selecting circuitry to receive said selected signal and configured to generate an intermediate signal in dependence upon said selected signal;
   state storing circuitry coupled to said power gated circuitry to receive said intermediate signal and configured to store a stored signal with a value dependent upon said intermediate signal;
   output generating circuitry coupled to said state storing circuitry, said output generating circuitry having a retention mode input and a data value output and being configured to generate an output signal for output from said data value output in dependence upon a retention mode signal received at said retention mode input and indicating operation in one of a retention mode and a functional mode such that: (i) during said functional mode, said output signal is dependent upon said stored signal; and (ii) during said retention mode, said output signal is a predetermined retention signal; and
   power supply circuitry coupled to said power gated circuitry, a first power supply and a second power supply, wherein
   said power supply circuitry and said input selecting circuitry are configured such that: (a) during said functional mode, said input selecting circuitry selects said functional signal and said power gating circuitry connects at least a first portion of said power gated circuitry to both said first power supply and said second power supply; (b) during said retention mode, said input selecting circuitry selects said scan input signal and said power supply circuitry isolates at least said first portion of said power gated circuitry from said first power supply and connects at least said first portion of said power gated circuitry to said second power supply; and (c) during both said functional mode and said retention mode said power supply circuitry connects at least a portion of said state storing circuitry to both said first power supply and said second power supply, wherein said power supply circuitry is configured such that: (d) during said functional mode, a second portion of said power gated circuitry is connected to both said first power supply and said second power supply; and (e) during said retention mode, said second portion of said power gated circuitry is isolated from said second power supply and is connected to said first power supply.

9. Apparatus as claimed in claim 8, wherein said power gated circuitry comprises a plurality of signal nodes and each of said plurality of signal nodes is driven by one of said first portion or said second portion.

10. Apparatus for storing a data value, said apparatus comprising:
input selecting circuitry having a scan enable input, a scan input and a functional input and configured to select for output as a selected signal in dependence upon a scan enable signal from said scan enable input one of a scan input signal from said scan input or a functional input signal from said functional input;
power gated circuitry coupled to said input selecting circuitry to receive said selected signal and configured to generate an intermediate signal in dependence upon said selected signal;
state storing circuitry coupled to said power gated circuitry to receive said intermediate signal and configured to store a stored signal with a value dependent upon said intermediate signal;
output generating circuitry coupled to said state storing circuitry, said output generating circuitry having a retention mode input and a data value output and being configured to generate an output signal for output from said data value output in dependence upon a retention mode signal received at said retention mode input and indicating operation in one of a retention mode and a functional mode such that: (i) during said functional mode, said output signal is dependent upon said stored signal; and (ii) during said retention mode, said output signal is a predetermined retention signal; and
power supply circuitry coupled to said power gated circuitry, a first power supply and a second power supply, wherein
said power supply circuitry and said input selecting circuitry are configured such that: (a) during said functional mode, said input selecting circuitry selects said functional signal and said power gating circuitry connects at least a first portion of said power gated circuitry to both said first power supply and said second power supply; (b) during said retention mode, said input selecting circuitry selects said scan input signal and said power supply circuitry isolates at least said first portion of said power gated circuitry from said first power supply and connects at least said first portion of said power gated circuitry to said second power supply; and (c) during both said functional mode and said retention mode said power supply circuitry connects at least a portion of said state storing circuitry to both said first power supply and said second power supply, wherein said state storing circuitry comprises balloon circuitry configured to store said stored signal during said retention mode and said power supply circuitry is configured to connect said balloon circuitry to both said first power supply and said second power supply during said retention mode.

11. Apparatus as claimed in claim 10, wherein said state storing circuitry comprises a power gated portion and said power supply circuitry is configured such that during said retention mode said power gated portion is isolated from one of said first power supply and said second power supply.

12. Apparatus for storing a data value, said apparatus comprising:
input selecting circuitry having a scan enable input, a scan input and a functional input and configured to select for output as a selected signal in dependence upon a scan enable signal from said scan enable input one of a scan input signal from said scan input or a functional input signal from said functional input;
power gated circuitry coupled to said input selecting circuitry to receive said selected signal and configured to generate an intermediate signal in dependence upon said selected signal;
state storing circuitry coupled to said power gated circuitry to receive said intermediate signal and configured to store a stored signal with a value dependent upon said intermediate signal;
output generating circuitry coupled to said state storing circuitry, said output generating circuitry having a retention mode input and a data value output and being configured to generate an output signal for output from said data value output in dependence upon a retention mode signal received at said retention mode input and indicating operation in one of a retention mode and a functional mode such that: (i) during said functional mode, said output signal is dependent upon said stored signal; and (ii) during said retention mode, said output signal is a predetermined retention signal; and
power supply circuitry coupled to said power gated circuitry, a first power supply and a second power supply, wherein
said power supply circuitry and said input selecting circuitry are configured such that: (a) during said functional mode, said input selecting circuitry selects said functional signal and said power gating circuitry connects at least a first portion of said power gated circuitry to both said first power supply and said second power supply; (b) during said retention mode, said input selecting circuitry selects said scan input signal and said power supply circuitry isolates at least said first portion of said power gated circuitry from said first power supply and connects at least said first portion of said power gated circuitry to said second power supply; and (c) during both said functional mode and said retention mode said power supply circuitry connects at least a portion of said state storing circuitry to both said first power supply and said second power supply, wherein said power supply circuitry comprises a first power rail coupled to said first power supply during both said retention mode and said functional mode and a second power rail coupled to said second power supply during both said retention mode and said functional mode.

13. Apparatus for storing a data value, said apparatus comprising:
input selecting circuitry having a scan enable input, a scan input and a functional input and configured to select for output as a selected signal in dependence upon a scan enable signal from said scan enable input one of a scan input signal from said scan input or a functional input signal from said functional input;

power gated circuitry coupled to said input selecting circuitry to receive said selected signal and configured to generate an intermediate signal in dependence upon said selected signal;

state storing circuitry coupled to said power gated circuitry to receive said intermediate signal and configured to store a store signal with a value dependent upon said intermediate signal;

output generating circuitry coupled to said state storing circuitry, said output generating circuitry having a retention mode input and a data value output and being configured to generate an output signal for output from said data value output in dependence upon a retention mode signal received at said retention mode input and indicating operation in one of a retention mode and a functional mode such that: (i) during said functional mode, said output signal is dependent upon said stored signal; and (ii) during said retention mode, said output signal is a predetermined retention signal; and power supply circuitry coupled to said power gated circuitry, a first power supply and a second power supply, wherein said power supply circuitry and said input selecting circuitry are configured such that: (a) during said functional mode, said input selecting circuitry selects said functional signal and said power gating circuitry connects at least a first portion of said power gated circuitry to both said first power supply and said second power supply; (b) during said retention mode, said input selecting circuitry selects said scan input signal and said power supply circuitry isolates at least said first portion of said power gated circuitry from said first power supply and connects at least said first portion of said power gated circuitry to said second power supply; and (c) during both said functional mode and said retention mode said power supply circuitry connects at least a portion of said state storing circuitry to both said first power supply and said second power supply, wherein said first power supply is a VDD power supply and said second power supply is a ground power supply.

14. Apparatus for storing a data value, said apparatus comprising:

input selecting means for selecting a selected signal for output, said input selecting means having a scan enable input, a scan input and a functional input, said input selecting means configured to select as said selected signal for output, in dependence upon a scan enable signal from said scan enable input, one of a scan input signal from said scan input or a functional input signal from said functional input;

power gated means for generating an intermediate signal in dependence upon said selected signal, said power gated means being coupled to said input selecting means to receive said selected signal;

state storing means for storing a stored signal with a value dependent upon said intermediate signal, said state storing means being coupled to said power gated means to receive said intermediate signal;

output generating means for generating an output signal, said output generating means having a retention mode input and a data value output, being coupled to said state storing means, and being configured to generate said output signal for output from said data value output in dependence upon a retention mode signal received at said retention mode input and indicating operation in one of a retention mode and a functional mode such that: (i) during said functional mode, said output signal is dependent upon said stored signal; and (ii) during said retention mode, said output signal is a predetermined retention signal; and power supply means for supplying power to said power gated means from a first power supply and a second power supply, wherein said power supply means and said input selecting means are configured such that: (a) during said functional mode, said input selecting means selects said functional signal and said power gating means connects at least a first portion of said power gated means to both said first power supply and said second power supply; (b) during said retention mode, said input selecting means selects said scan input signal and said power supply means isolates at least said first portion of said power gated means from said first power supply and connects at least said first portion of said power gated means to said second power supply; and (c) during both said functional mode and said retention mode said power supply means connects at least a portion of said state storing means to both said first power supply and said second power supply, wherein said power supply means comprises a first virtual power rail coupled to said first power supply by first power switching gates and said first power switching gates are configured to isolate said first virtual power rail from said first power supply during said retention mode.

15. A method of storing a data value, said method comprising the steps of:

selecting as a selected signal, in dependence upon a scan enable signal, one of a scan input signal or a functional input signal;

generating with power gated circuitry an intermediate signal in dependence upon said selected signal;

storing with state storing circuitry a stored signal with a value dependent upon said intermediate signal;

generating an output signal in dependence upon a retention mode signal indicating operation in one of a retention mode and a functional mode such that: (i) during said functional mode, said output signal is dependent upon said stored signal; and (ii) during said retention mode, said output signal is a predetermined retention signal; and supplying power to said power gated circuitry form a first power supply and a second power supply, wherein (a) during said functional mode, said functional signal is selected and at least a first portion of said power gated circuitry is connected to both said first power supply and said second power supply; (b) during said retention mode, said scan input signal is selected, at least said first portion of said power gated circuitry is isolated from said first power supply and at least said first portion of said power gated circuitry is connected to said second power supply; and (c) during both said functional mode and said retention mode at least a portion of said state storing circuitry is connected to both said first power supply and said second power supply, and said step of supplying power uses a first virtual power rail coupled to said first power supply by first power switching gates and said first power switching gates isolate said first virtual power rail from said first power supply during said retention mode.

\* \* \* \* \*